United States Patent
Sbiaa

(10) Patent No.: US 7,423,851 B2
(45) Date of Patent: Sep. 9, 2008

(54) MAGNETO-RESISTIVE ELEMENT AND DEVICE BEING PROVIDED WITH MAGNETO-RESISTIVE ELEMENT HAVING MAGNETIC NANO-CONTACT

(75) Inventor: Rachid Sbiaa, Tokyo (JP)

(73) Assignee: TDK Corporation, Tokyo (JP)

( * ) Notice: Subject to any disclaimer, the term of this patent is extended or adjusted under 35 U.S.C. 154(b) by 201 days.

(21) Appl. No.: 10/949,352

(22) Filed: Sep. 27, 2004

(65) Prior Publication Data
US 2005/0111144 A1 May 26, 2005

Related U.S. Application Data

(60) Provisional application No. 60/506,741, filed on Sep. 30, 2003.

(51) Int. Cl.
*G11B 5/33* (2006.01)
(52) U.S. Cl. .................................. 360/324.2
(58) Field of Classification Search ............. 360/324.2, 360/324.1
See application file for complete search history.

(56) References Cited

U.S. PATENT DOCUMENTS

| | | | | |
|---|---|---|---|---|
| 5,715,121 | A * | 2/1998 | Sakakima et al. | 360/324.2 |
| 6,069,820 | A * | 5/2000 | Inomata et al. | 365/171 |
| 6,560,077 | B2 * | 5/2003 | Fujiwara et al. | 360/324.1 |
| 6,686,068 | B2 * | 2/2004 | Carey et al. | 428/811.3 |
| 6,707,649 | B2 * | 3/2004 | Hasegawa et al. | 360/324.12 |
| 6,937,447 | B2 * | 8/2005 | Okuno et al. | 360/324.1 |
| 7,002,781 | B2 * | 2/2006 | Sugawara | 360/324.11 |
| 7,050,276 | B2 * | 5/2006 | Nishiyama | 360/324.11 |
| 2004/0042127 | A1 * | 3/2004 | Hosiya et al. | 360/322 |
| 2004/0201929 | A1 * | 10/2004 | Hashimoto et al. | 360/324.1 |
| 2005/0099724 | A1 * | 5/2005 | Nakamura et al. | 360/125 |

FOREIGN PATENT DOCUMENTS

| | | | |
|---|---|---|---|
| JP | 09-172212 | * | 6/1997 |
| JP | A-11-510911 | | 9/1999 |
| JP | A-2003-204095 | | 7/2003 |

OTHER PUBLICATIONS

N. Garcia et al.; "Magnetoresistance in excess of 200% in Ballistic Ni Nanocontacts at Room Temperature and 100 Oe"; *Physical Review Letters*; The American Physical Society; vol. 82, No. 14; Apr. 5, 1999; pp. 2923-2926.

N. Garcia et al.; "Balistic magnetoresistance in nanocontacts electro-chemically grown between macro- and microscopic ferromagnetic electrodes"; *Applied Physics Letters*; vol. 80; No. 10; American Institute of Physics; Mar. 11, 2002; pp. 1785-1787.

J. M. D. Coey et al.; "Magnetic excitations in a nanocontact"; *Physical Review B*; vol. 64, 020407(R); The American Physical Society; 2001; pp. 020407-1-020407-3.

A.A. Zvezdin et al.; "Spontaneous Transformations of the Magnetic Structure of a Film Nanocontact"; *JETP Letters*; vol. 75, No. 10; 2002; pp. 518-519.

* cited by examiner

*Primary Examiner*—Angel A Castro
(74) *Attorney, Agent, or Firm*—Oliff & Berridge, PLC

(57) ABSTRACT

A magnetoresistive element including a pinned layer in exchange coupling with an antiferromagnetic layer, a free layer whose magnetization rotates or switches according to a media magnetic field, an intermediate layer between the free layer and the pinned layer. The intermediate layer including magnetic grains surrounded by an insulator, and the magnetic grains connect the free and pinned layer by means of a nano contact.

10 Claims, 4 Drawing Sheets

US 7,423,851 B2

MAGNETO-RESISTIVE ELEMENT AND DEVICE BEING PROVIDED WITH MAGNETO-RESISTIVE ELEMENT HAVING MAGNETIC NANO-CONTACT

This nonprovisional application claims the benefit of U.S. Provisional Application No. 60/506,741, filed Sep. 30, 2003.

FIELD OF THE INVENTION

The present invention relates to a magneto-resistive element, for a magnetoresistive head, for example, device being provided with magneto-resistive element, a device provided with a nano-contact structure, and method for producing nano-contact structure.

DESCRIPTION OF THE RELATED ART

Recently, the magnetic recording density has increased rapidly. In order to match this progress, a high sensitive head is required with a small size. It was reported that using ballistic effect a very high resistance change can be obtained as shown in S. Z. Hua et. al., Phys. Review B67, 060401 (R) (2003). This is possible when at least two ferromagnetic layers are connected to each other via a nano-contact. The origin of ballistic magneto-resistive (herein after BMR) effect, as described by G. Tatara et. al., Phys. Review Letters, Vol. 83, 2030 (1999), comes from the very thin magnetic domain wall created between the two ferromagnetic layers.

SUMMARY OF THE INVENTION

This invention focuses on the magnetoresistive elements and a method of fabrication of nano-contacts using a magnetic grains immerged in an insulator matrix of $Al_2O_3$, $SiO_2$, $TaO_2$, $Si_3N_4$ and the like.

An advantage of this method is that it avoids the lithography techniques used to fabricate the nano-contacts. This method allowed the deposition by sputtering a nano-contact in a continuous process like standard spin-valve processes. The height of a nano-contact can be controlled very precisely by controlling the deposition rate and time. The width can be controlled by controlling the relative amount of insulator and magnetic material. From experience with media technology, grain sizes below 6 nm can be obtained with high thermal stability.

In this invention, different methods of forming magnetic grains surrounded by an insulator with adjustable size will be described.

DESCRIPTION OF THE PREFERRED EMBODIMENTS

Figure 1:
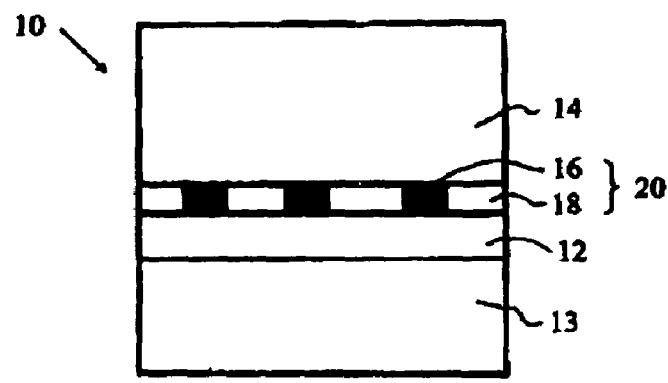
FIG. 1 is a cross-sectional view showing an enlarged schematic representation of a magneto-resistive element according to an embodiment of the present invention.

As shown in FIG. 1, a magnetoresistive element 10 according to an embodiment of the present invention is composed of an antiferromagnetic layer 13, a pinned layer 12 in exchange coupling with the antiferromagnetic layer 13, a free layer 14 which magnetization rotates or switches according to a media magnetic field (not shown) and magnetic grains 16 surrounded by an insulator 18. The magnetic grains 16 are connecting the free layer 14 and the pinned layer 12.

The magnetic grains 16 and the insulator 18 constitute an intermediate layer 20. The magnetic grains 16 are decoupled from each other by increasing the grain boundary region formed by the insulator 18 that is formed from oxide or nitride.

The pinned layer 12 and the free layer 14 are made from a magnetic single layer, having a synthetic structure composed from two antiferromagnetically coupled layers separated by a non magnetic spacer such as Ru, Rh, Cu . . . etc., or composed of multilayer like CoFe/NiFe for example.

CoFe/NiFe, two ferromagnetic layers, means a composed structure of a CoFe layer and a NiFe layer, in which the CoFe layer is made substantially of Co and Fe and the NiFe layer is made substantially of Ni and Fe. Further, other two layers structure, CoFe/NiFe, Co/NiFe . . . etc., may be used as the composed structure.

The material of the magnetic grains 16, composing the nano-contact, is made from a material including at leat one of Co, Fe and Ni.

The thickness of intermediate layer 20 between the pinned layer 12 and the free layer 14 is below 10 nm. It is preferably around 1 nm. The BMR value is much higher as the size of nano-contact (in terms of both the height and width) decreases.

For BMR effect, if many nano-dots or grains are formed between the free layer 14 and pinned layers 12, there should be no interaction between a nano-dot and another nano-dot. This will be achieved by providing an insulator layer which surrounds the nano-dot. The magnetic domain wall created in the nano-contact (within grains) is responsible for high resistance change. If there is an interaction between grains this might affect the domain wall and consequently the MR ratio.

FIG. 1 in US patent 2003/0091846 A1, shows that grains of 10 nm can be made regularly using an $SiO_2$ insulator, and the grain boundary in this figure is about 1 nm. As a process for oxidizing the intermediate layer 20, natural oxidation (oxidation with oxygen flow or in air for example) is possible. However, assisted oxidation can be performed in a vacuum chamber using a low oxygen pressure and ion beam, which acts to accelerate the oxidation of the non-magnetic part of the intermediate layer 20.

Figure 2:
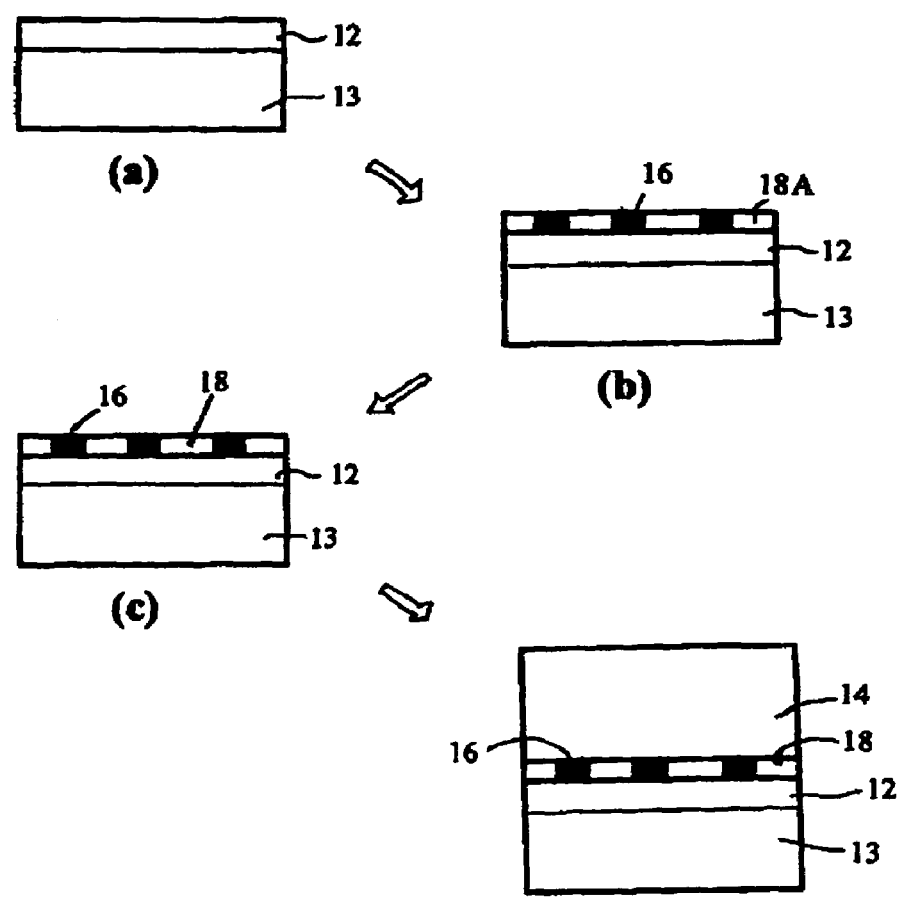
FIG. 2 is cross-sectional view showing an enlarged schematic representation of a process for manufacturing a magneto-resistive element according to an embodiment of the present invention.

Now, a first method for producing a BMR element including a nano-contact structure is described with reference to FIG. 2.

Figure 3:
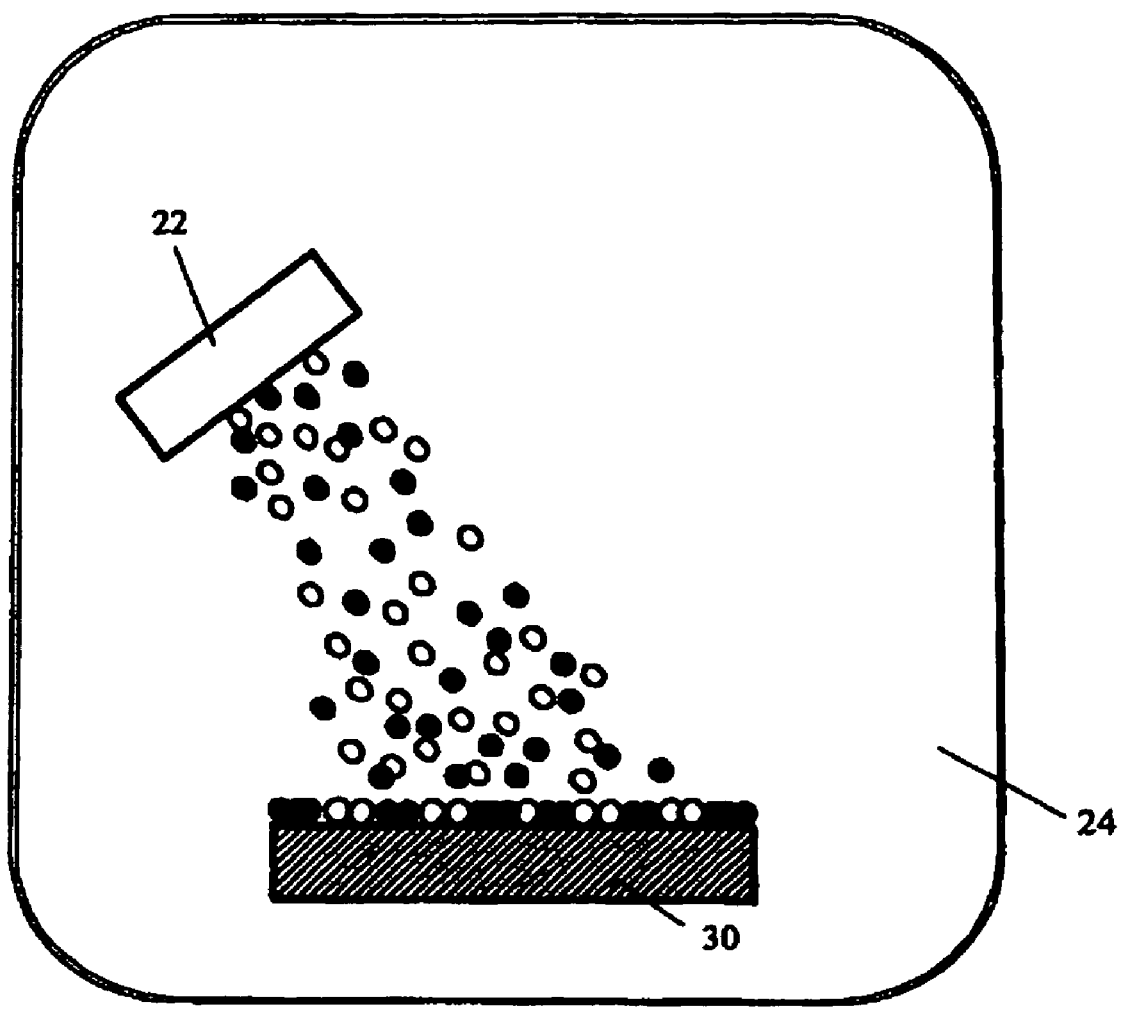
FIG. 3 is a side view showing a schematic representation of a method of making nano-dots immerged in an insulator matrix using a single target magnetic/non-magnetic alloy.

The first method for producing a nano-contact structure comprises, as shown in FIGS. 2(a) and (b), a process for depositing magnetic grains 16 surrounded by a non-magnetic metallic material 18A. This is released from a single target magnetic/non magnetic alloy 22, as shown in FIG. 3, in a vacuum chamber 24 of a vacuum depositing apparatus on the pinned layer 12. This is formed up to an intermediate layer 20 with a thickness of between one atom size and 10 nm. Shown in FIG. 2(c) is a process for oxidizing the non-magnetic metallic material 18A of the intermediated layer 20 and changing it to an insulator 18. FIG. 2(d) is a view showing a process for depositing the free layer 14 on the intermediated layer 20. A numeral 30 in FIG. 3 denotes a substrate on which the free layer 14 and the pinned layer 12 are deposited.

The single target 22 in FIG. 3 is composed of magnetic and non-magnetic metallic material such as Al, Ta, . . . etc., with the non-magnetic metallic material being selected from the category exhibiting higher oxidation rates than the magnetic grains. The single target 22 may be composed of blocks of the magnetic metallic material and blocks of the non-magnetic metallic material.

The process for oxidizing the intermediate layer 20 is performed to control both the size of the magnetic grains 16 and the proportion of the magnetic grains 16 to the insulator 18.

The first method is a simple way of making magnetic grains or nano-dots between the two ferromagnetic layers 12 and 14. The pinned and free layers 12 and 14 are connected through these magnetic grains 16. Only the magnetic grains 16 with a small size will contribute to BMR effect.

A second method for producing a BMR element is described with reference to FIG. 4 and FIG. 5.

Figure 4:
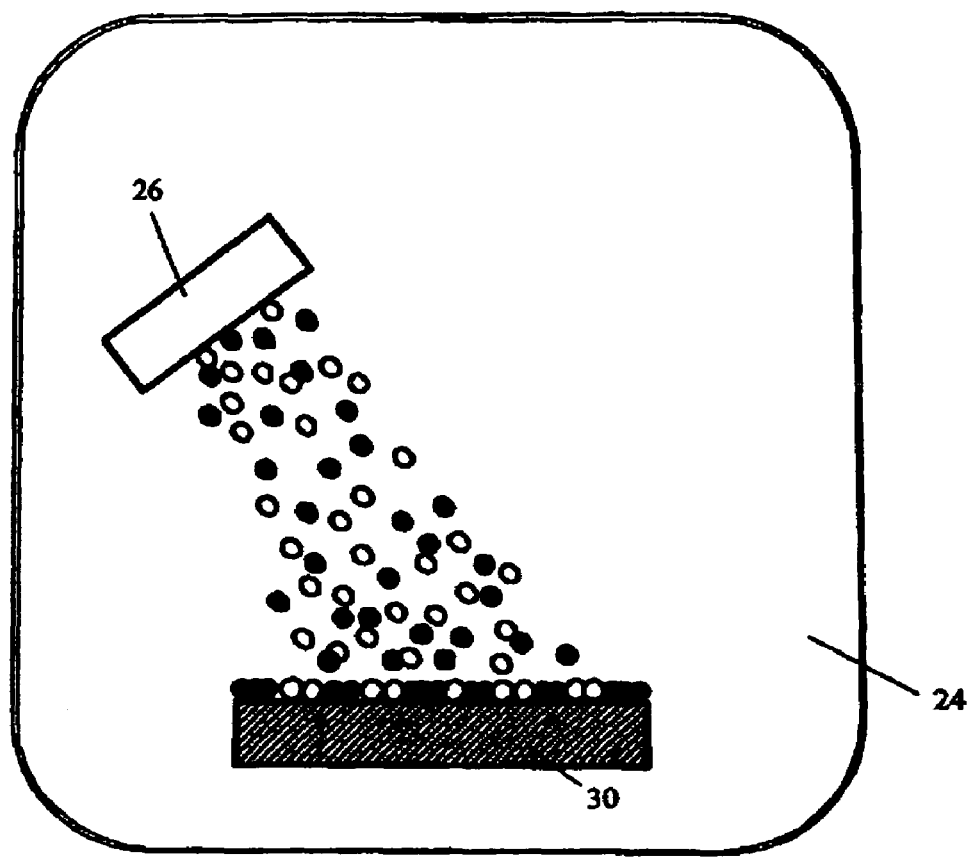
FIG. 4 is a side view showing a schematic representation of a method of making nano-dots immerged in an insulator matrix using a composed target.

The second method for producing a nano-contact structure comprises: a process for depositing nano magnetic grains 16 released from a composed target 26 in the vacuum chamber 24 as shown in FIG. 4 to form up to an intermediate layer 20 in a thickness of between one atom size and 10 nm; a process for oxidizing the non magnetic metallic part of the intermediated layer 20; and a process for depositing the free layer 14 on the intermediate layer 20.

Figure 5:
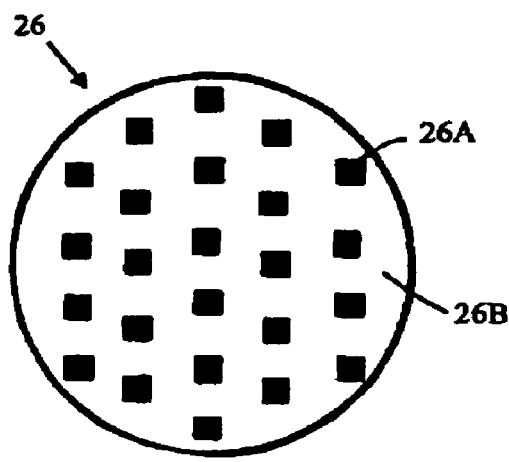
FIG. 5 is an enlarged top view showing a schematic representation of a target surface used in the process.

The composed target 26 is made of a magnetic material 26B which has on its surface non-magnetic metallic chips 26A, as shown in FIG. 5. The surface ratio of the non-magnetic metallic chips 26A which are in a regular arrangement preferably on the magnetic material 26B can vary to form grains of desired size.

In US patent 2003/0157375 A1, it was demonstrated that the volume ratio between grain boundary portion and magnetic grains could be adjusted from 10 to 80% by increasing the amount of insulator in the target. The insulator was made from $SiO_2$, $Al_2O_3$ or $Si_3N_4$.

Figure 6:
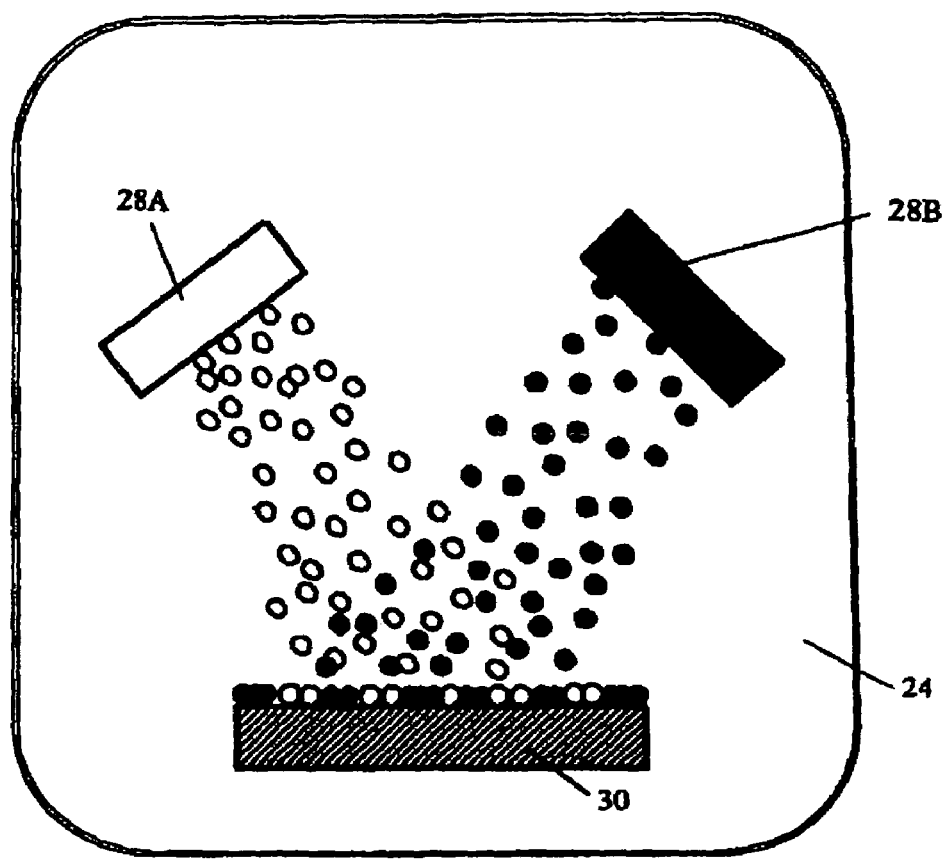
FIG. 6 is a side view showing a schematic representation of a method of making magnetic nano-dots immerged in an insulator matrix using two different targets.

There are three types of a composed target other than the above composed target 26, which are made of an insulator having on its surface magnetic chips, a magnetic material having on its surface insulator chips, a non-magnetic metallic material having on its surface magnetic chips in which the metallic material is oxidized to form an insulator and. A third method for producing a BMR element is described with reference to FIG. 6 and FIG. 7.

The third method for producing a nano-contact structure comprises: a process for depositing grains, released from two targets 28A and 28B of a magnetic material and non-magnetic metallic material respectively, on a substrate 30 (the pinned layer 12 is not shown) in the vacuum chamber 24 to form up to an intermediate layer 20 in a thickness between one atom size and 10 nm; a process for oxidizing the non-magnetic metallic part of the intermediate layer 20 and changing it to an insulator; and a process for depositing the free layer 14 on the intermediate layer 20. On the process in the vacuum chamber 24, the deposition rate and other deposition parameters, including power, pressure, distance from the target to the substrate 30, angle between the target and the substrate 30 as the deposition conditions, are adjusted to control the size of the magnetic grain and volume ratio between the magnetic grains and the insulator.

It was demonstrated that the BMR effect is strongly dependent on size of the magnetic nano-contact as described by Tatara et. al. This means that only nano-dots or grains, which have small size will contribute to BMR. The effect of other grains with larger size will be so small that it can be ignored.

Figure 7:
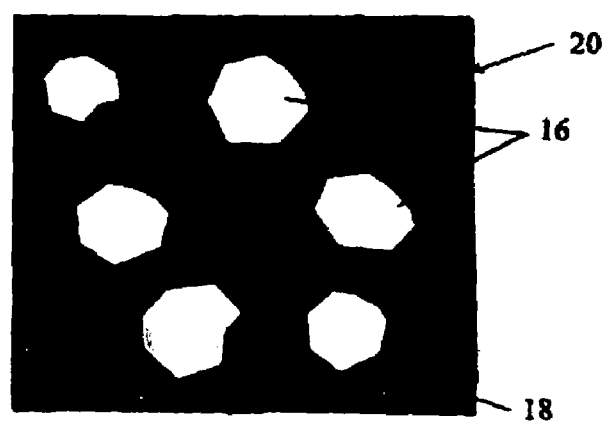
FIG. 7 is a top view showing an enlarged schematic representation of the formed magnetic grains immerged in an insulator.

As shown in FIG. 7, the formed magnetic grains 16 are immerged within the insulator 18. These grains 16 will serve as nano-contact between the pinned layer 12 and the free layer 14 in the magnetoresistive device. The magnetic nano-contacts can be made small by adjusting the ratio between the magnetic material content and the insulator content.

In the above embodiments, the intermediate layer 20 is formed on the pinned layer 12. However the intermediate layer 20 may be formed on the free layer 14, then, the pinned layer 12 is formed thereon.

Further, the magnetization direction may be substantially fixed in the pinned layer 12. Therefore, the antiferromagnetic layer may be replaced by a hard magnet layer having high coercive force Hc or the pinned layer may be replaced by a hard magnet layer without the antiferromagnetic layer.

The above embodiments are related to a magnetoresistive element for a read head in a magnetic recording device such as HDD, for example. However, the present invention is not limited to the magnetoresistive head but also includes other devices using a ballistic magnetoresistive effect, such as a magnetic random access memory (a magnetic memory device being provided with nano-contact structure).

What is claimed is:

1. A magnetoresistive element comprising:
    a pinned layer whose magnetization direction is substantially fixed;
    a free layer whose magnetization direction rotates or switches according to a media magnetic field; and
    an intermediate layer between the free layer and the pinned layer, the intermediate layer including magnetic grains surrounded by an insulator, each single grain of the magnetic grains is decoupled from each other by the insulator, and the magnetic grains connecting the free layer and the pinned layer by means of a nano contact,
    wherein the insulator is not formed from an oxide of a material that forms the magnetic grains.

2. The magnetoresistive element according to claim 1, wherein the magnetic grains are decoupled from each other by increasing the grain boundary region formed by the insulator.

3. The magnetoresistive element according to claim 1, wherein the insulator is formed from an oxide or a nitride.

4. The magnetoresitive element according to claim 1, wherein at least one of the pinned layer and the free layer is formed from a ferromagnetic single layer.

5. The magnetoresitive element according to claim 1, wherein at least one of the pinned layer and the free layer is a synthetic structure including two antiferromagnetically coupled layers separated by a non magnetic spacer.

6. The magnetoresitive element according to claim 1, wherein the pinned layer and the free layer are composed of a multilayer structure comprising two or more laminated ferromagnetic layers.

7. The magnetoresistive element according to claim 1, wherein the material composing the nano-contact is made from the same or a different material than the pinned layer or free layer.

8. The magnetoresistive element according to claim 1, wherein the thickness of the intermediate layer between the pinned layer and the free layer is below 10 nm.

9. The magnetoresistive element according to claim 1, wherein the height and width of the magnetic grains are between one atom size and 10 nm.

10. A device including a magnetoresistive element provided with a nano-contact structure exhibiting a ballistic magnetoresistive effect, the device comprising a magnetoresistive element composed of a pinned layer whose magnetization direction is substantially fixed;

a free layer whose magnetization direction rotates or switches according to a media magnetic field; and an intermediate layer between the free layer and the pinned layer, the intermediate layer including magnetic grains surrounded by an insulator, each single grain of the magnetic grains is decoupled from each other by the insulator, and the magnetic grains connecting the free layer and the pinned layer by means of the nano contact, wherein the insulator is not formed from an oxide of a material that forms the magnetic grains.

* * * * *